United States Patent
Abe

[11] Patent Number: 6,149,449
[45] Date of Patent: Nov. 21, 2000

[54] IC SOCKET

[75] Inventor: Shunji Abe, Yokohama, Japan

[73] Assignee: Yamaichi Electronics Co., Ltd., Tokyo, Japan

[21] Appl. No.: 09/069,863

[22] Filed: Apr. 30, 1998

[30] Foreign Application Priority Data

May 1, 1997 [JP] Japan .................................. 9-113786

[51] Int. Cl.⁷ .................................................. H01R 11/22
[52] U.S. Cl. ........................................... 439/268; 439/266
[58] Field of Search .................... 439/265–268, 439/68, 73, 330, 331

[56] References Cited

U.S. PATENT DOCUMENTS

| | | | |
|---|---|---|---|
| 4,420,205 | 12/1983 | Kirkman | 439/266 |
| 5,186,642 | 2/1993 | Matsuoka et al. | 439/266 |
| 5,556,293 | 9/1996 | Pfaff | 439/266 |
| 5,611,705 | 3/1997 | Pfaff | 439/266 |
| 5,807,127 | 9/1998 | Ohshima | 439/266 |

FOREIGN PATENT DOCUMENTS

| | | |
|---|---|---|
| 3-66787 | 10/1991 | Japan . |
| 6-30280 | 4/1994 | Japan . |

*Primary Examiner*—Hien Vu
*Attorney, Agent, or Firm*—Wenderoth, Lind and Ponack, L.L.P.

[57] ABSTRACT

An IC socket includes a moving plate capable of movement along an upper surface of a socket body. Contacts mounted in the socket body and external contact members arranged on an IC can be brought into and out of contact with each other through movement of the moving plate. The moving plate is capable of diagonal movement towards a corner portion along a diagonal line of the socket body.

23 Claims, 8 Drawing Sheets

IC SOCKET

BACKGROUND OF THE INVENTION

This invention relates to an IC socket for engaging and disengaging an IC loaded thereon, by moving a moving plate.

Japanese Patent Publication No. 30280/94 discloses an IC socket, in which an electrical connection between the IC socket and an IC loaded thereon is made by moving a pair of moving plates along an upper surface of a socket body and in parallel relation to two opposing sides of the socket body.

A plurality of contacts are arranged in a lattice pattern to corresponding with a plurality of external contacts which are also arranged in a lattice pattern on an IC. Resilient contact elements of the respective contacts are resiliently displaced either in a column direction or in a row direction through movement of each moving plate in a direction parallel to the sides of the socket body so that the contact are moved into or out of contact with the external contacts arranged on the IC.

However, when the contacts are arranged in a lattice pattern consisting of columns and rows and the resilient contact elements are resiliently displaced in the column and row directions, sufficient spaces in the column and row directions between adjacent contacts cannot be obtained. Therefore, a sufficient amount of displacement of the resilient contact element of each contact cannot be obtained, and the external contacts of the IC and the contacts of the socket cannot be effectively arranged at smaller pitches.

Another proposal is presented in Japanese Patent Publication No. 66787/91. In this proposal, each of the columns and rows of contacts arranged in a lattice pattern is diagonally arranged with respect to each side of the socket body and the resilient contact element of each contact is displaced along the diagonal direction of the lattice pattern arrangement. In other words, each contact column and each contact row is diagonally arranged with respect to the sides of the socket body, and the resilient contact element of each contact is displaced in parallel to each side of the socket body so that electrical connection and disconnection can be achieved.

In this prior art, however, although there are such advantages that sufficient spaces in the diagonal directions between adjacent contacts can be obtained and a sufficient amount of resilient displacement of each resilient contact element can be obtained, it has the following disadvantages. When the lattice arrangement pattern of the contacts is diagonally arranged with respect to a square socket body, the socket body is required to have lateral sides corresponding to the lengths of the diagonal lines of such a pattern, thus resulting in a large size of the socket body. In other words, the number of the contacts receivable in the socket body having such a predetermined dimensional size is extensively reduced.

Moreover, since the IC must be inserted into and removed from the socket body diagonally and with a predetermined angle of rotation, a design change of a robot for performing the job of inserting the IC into and removing the IC from the socket body inevitably occurs.

The present invention has been accomplished in view of the above situation.

SUMMARY OF THE INVENTION

It is, therefore, a general object of the present invention to provide an IC socket capable of obviating the above-mentioned inconveniences inherent in the prior devices.

In order to achieve the above object, there is essentially provided an IC socket including a moving plate capable of movement along an upper surface of a socket body, and contacts mounted in the socket body such that external contact members of an IC can be brought into and out of contact with the contacts, through movement of the moving plate, and wherein the moving plate is capable of diagonal movement towards a corner portion along a diagonal line of the socket body or otherwise at an angle of inclination with respect to a side of the socket body.

The contacts are preferably arranged such that resilient contact pieces thereof are resiliently displaced in a direction of diagonal movement of the moving plate.

It is preferred that a diagonal movement force is applied to a corner portion of the moving plate.

DETAILED DESCRIPTION OF THE EMBODIMENT

One embodiment of the present invention will now be described in detail with reference to FIGS. 1 to 14 of the accompanying drawings.

As shown in FIGS. 1 to 4, reference numeral 1 denotes a socket body having a square outer configuration and made of insulating material. The socket body 1 has a plurality of contacts 2. The contacts 2 are arranged in a lattice pattern which, when viewed in FIGS. 3A and 4A, consist of vertical columns Y2 and horizontal rows X2 such that the contacts 2 of the vertical columns Y2 are in parallel relation to a vertical side Y1 of the socket body 1 and the contacts of the horizontal rows X2 are in parallel relation to a horizontal side X1 of the socket body 1.

Figure 13:
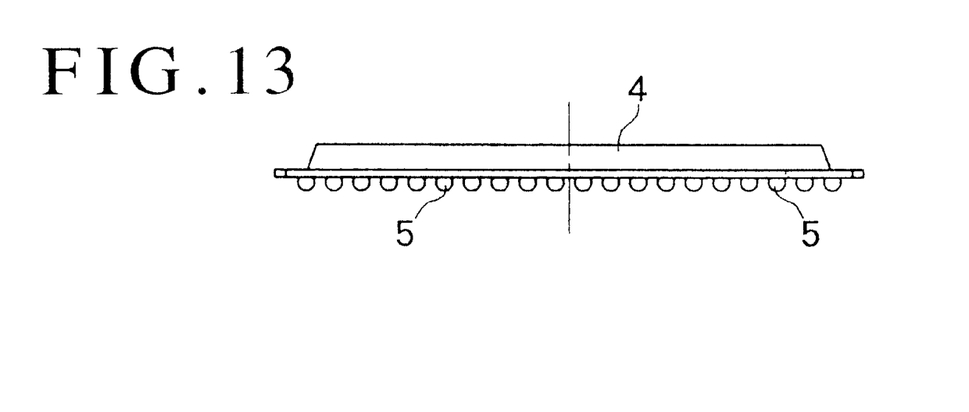
FIG. 13 is a side view of a BGA (Ball Grid Array) type IC package.
Figure 14:
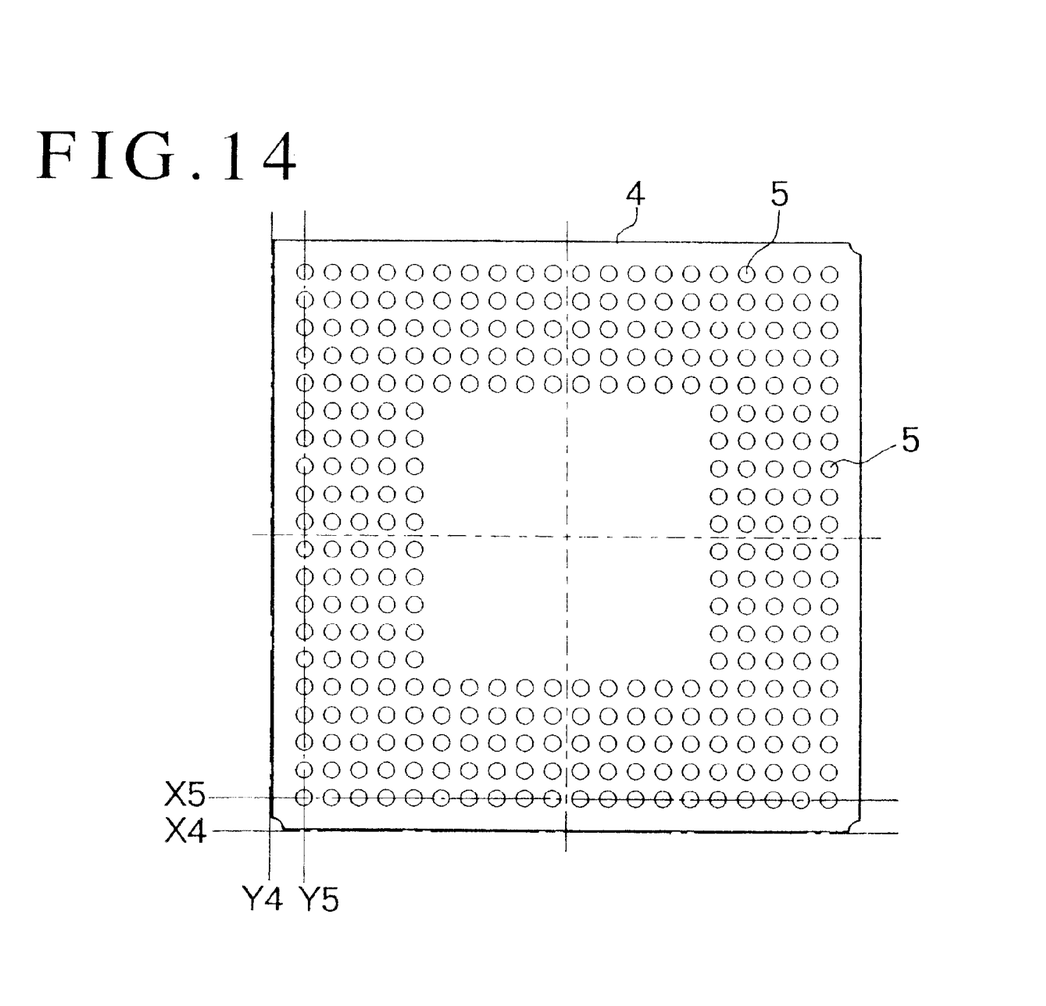
FIG. 14 is a bottom view of the IC package.

On the other hand, an IC 4 has a plurality of external contacts 5 as shown in FIGS. 13 and 14. The external contacts 5 are arranged in a lattice pattern which, when viewed in FIG. 14, consist of vertical columns Y5 and horizontal rows X5, on a lower surface of the square IC 4. The vertical columns Y5 of the external contacts 5 thus arranged in the lattice pattern are in parallel relation to the vertical side Y4 of the IC 4 and the horizontal columns X5 are likewise in parallel relation to the horizontal side X4 of the IC 4.

Figure 1:
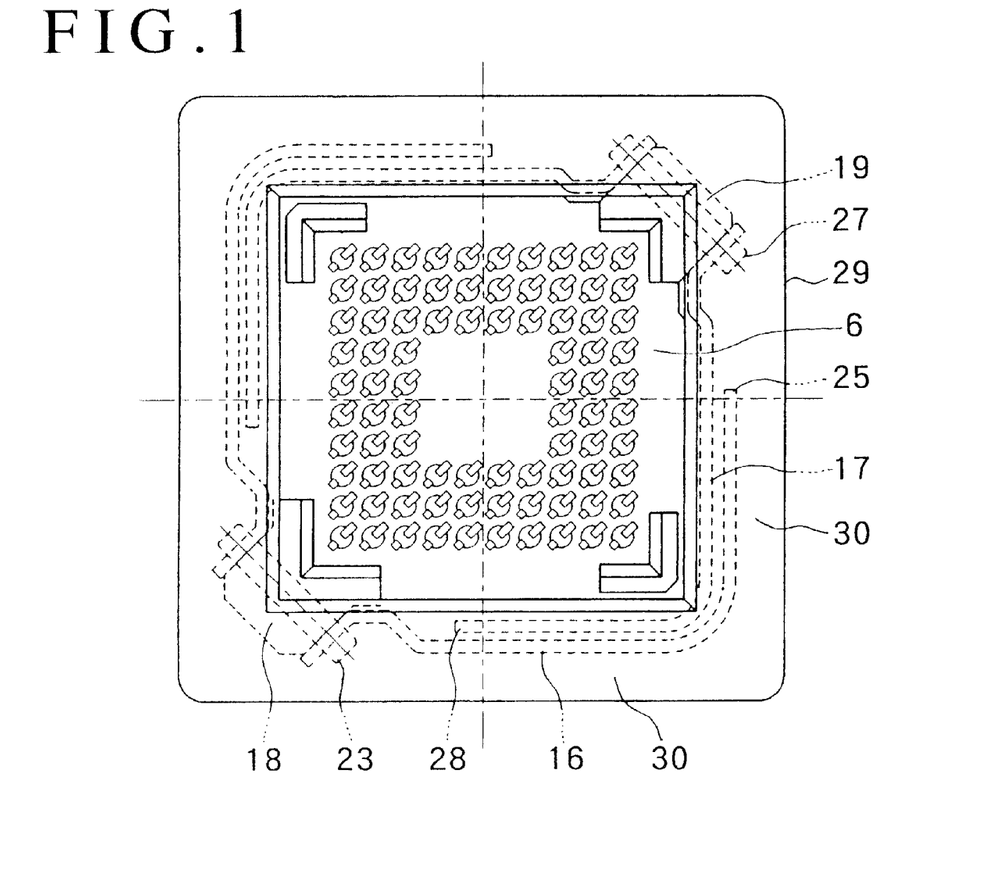
FIG. 1 is a plan view of an IC socket.
Figure 2:
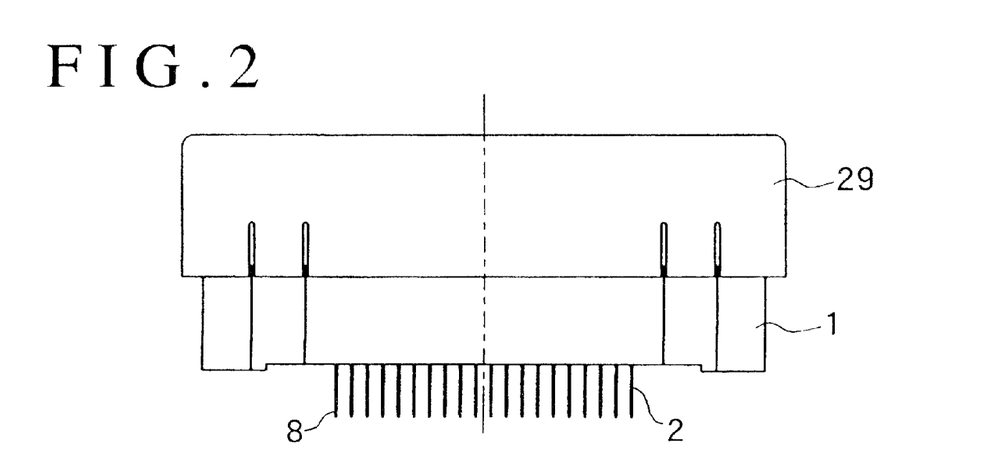
FIG. 2 is a side view of the IC socket.
Figure 3A:
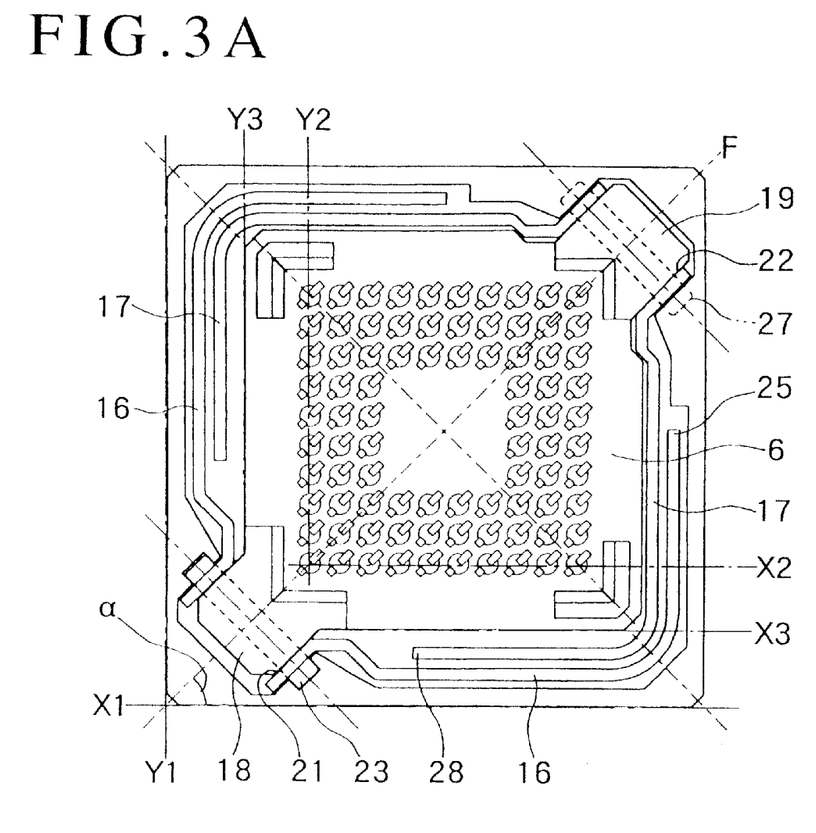
FIG. 3A is a plan view of the IC socket, from which an upper control member has been removed and in which a moving plate has been diagonally moved in a first direction.
Figure 3B:
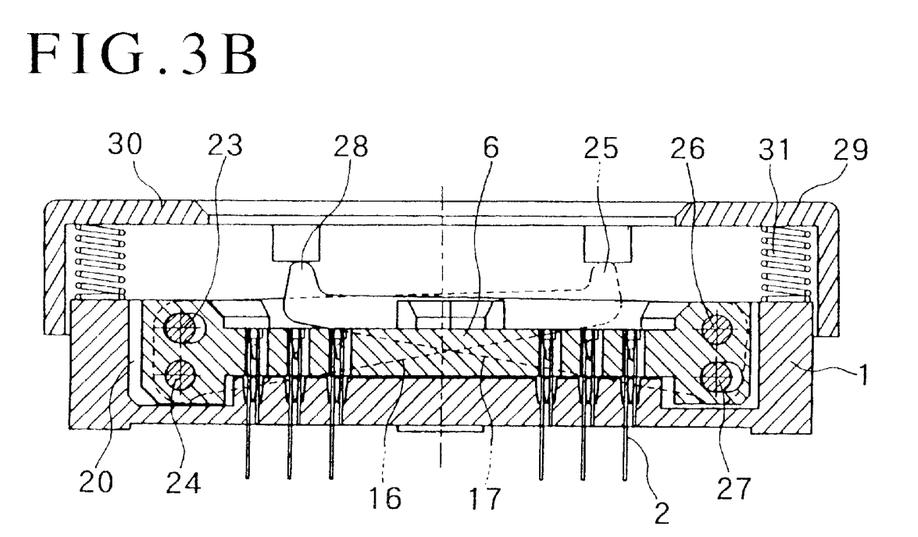
FIG. 3B is a sectional view taken along a diagonal line F of FIG. 3A but in which the upper control member is overlaid on the socket.
Figure 4A:
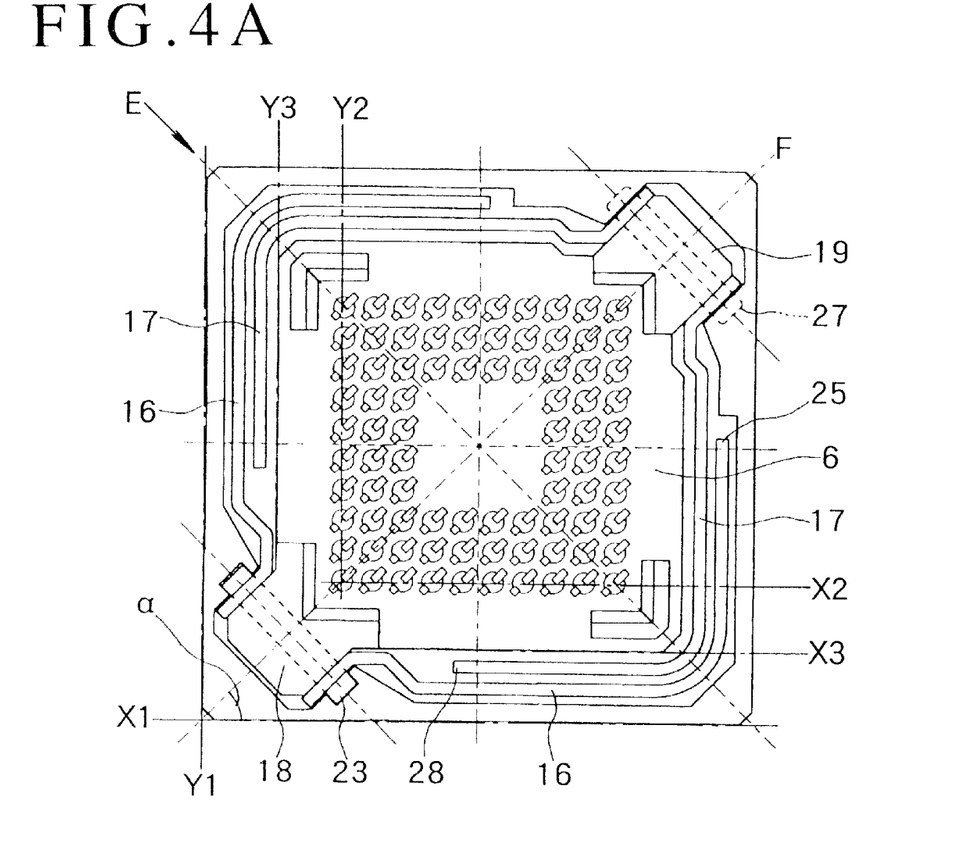
FIG. 4A is a plan view of the IC socket, from which an upper control member has been removed and in which a moving plate has been diagonally moved in a second direction.
Figure 4B:
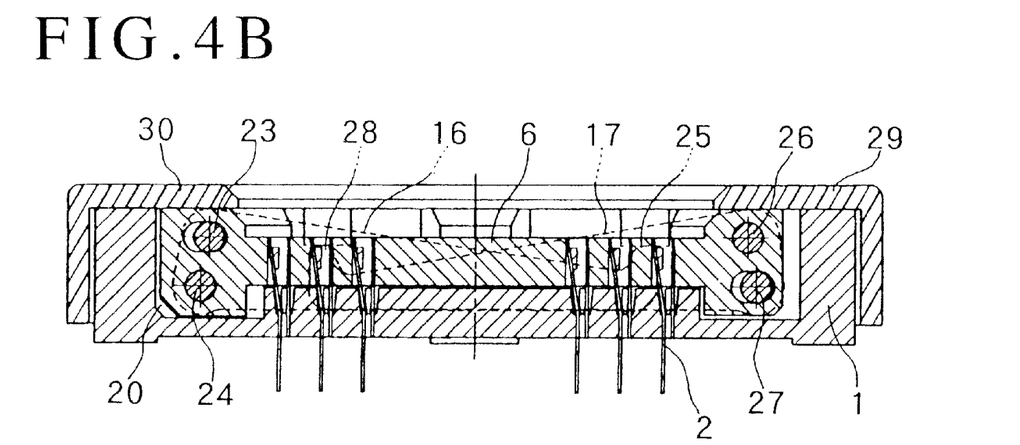
FIG. 4B is a sectional view taken along a diagonal line F of FIG. 4A but in which the upper control member is overlaid on the socket.

A moving plate 6 having a square configuration and made of insulating material is diagonally movably disposed along an upper surface of the socket body 1. As shown in FIGS. 3 and 4, when this movable plate 6 is diagonally moved in one direction, the contacts 2 had by the socket body 1 and the external contacts 5 had by the IC 4 are brought out of engagement with each other, and when the plate 6 is diagonally moved in the other direction, the contacts 2 and 5 are brought into engagement with each other.

In one example, when the moving plate 6 is diagonally moved, the IC 4 is also diagonally moved together with the moving plate 6 so that the external contacts 5 of the IC 4 are brought into contacting positions in which the contacts 5 are pressed against the resilient contact elements of the contacts 2.

Figure 9:
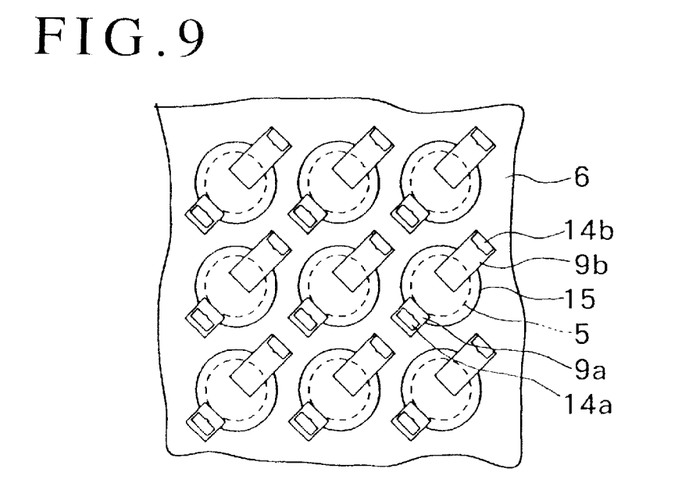
FIG. 9 is a plan view of the main portions of the contacts and the moving plate when the moving plate is diagonally moved in one direction to dilate the contacts.
Figure 10:
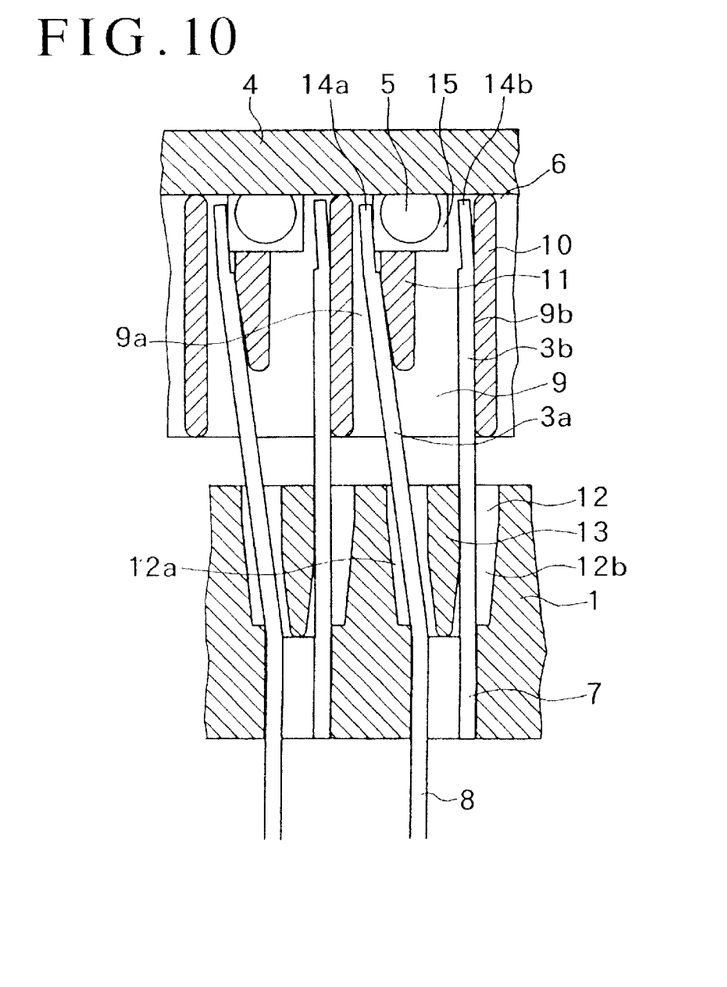
FIG. 10 is a sectional view taken along the diagonal line D of FIG. 9.
Figure 11:
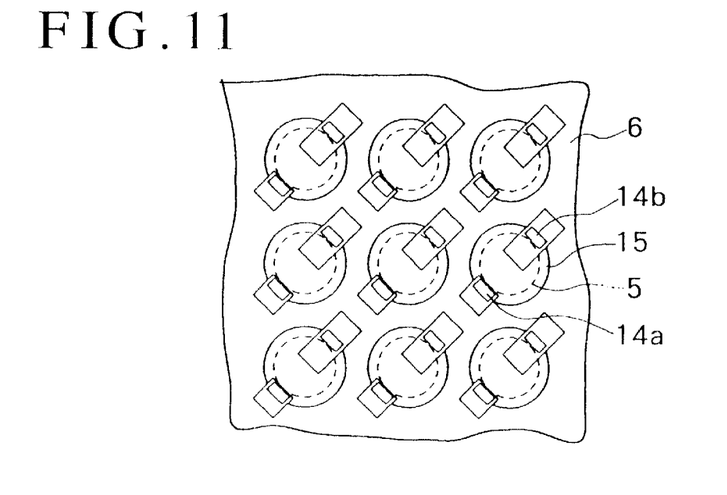
FIG. 11 is a plan view of the main portions of the contacts and the moving plate when the moving plate is diagonally moved in the other direction to resiliently restore the contacts into their closed positions, thereby pinching the ball type external contacts, respectively.
Figure 12:
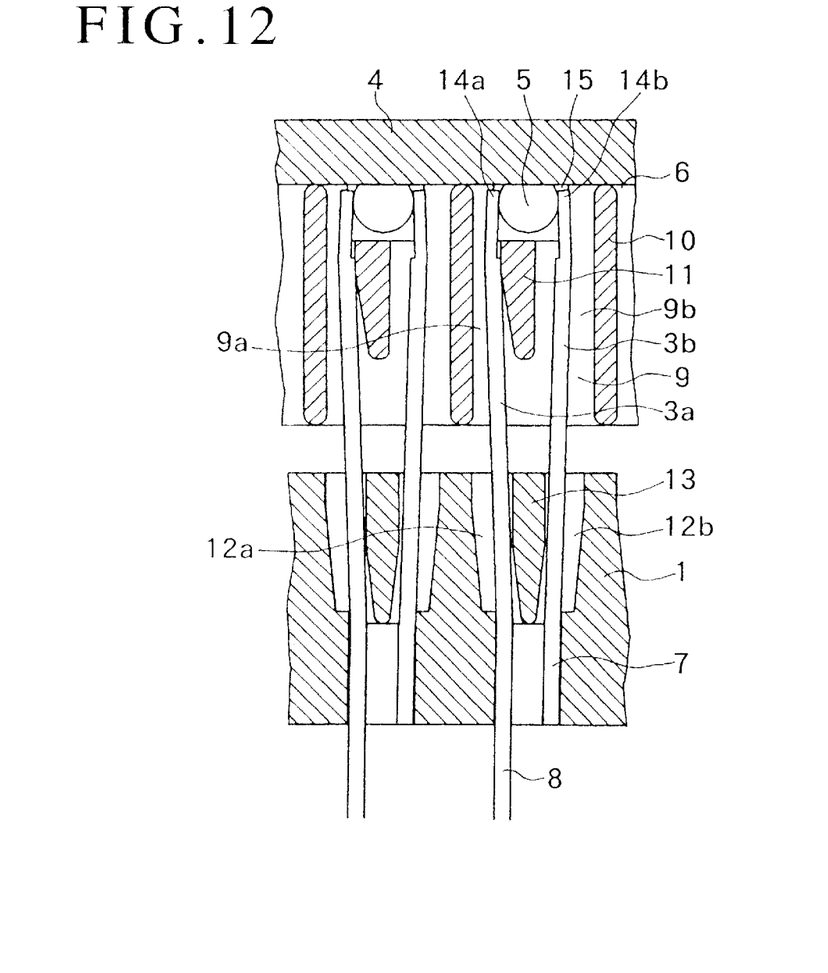
FIG. 12 is a sectional view taken along the diagonal line D of FIG. 10.

In another example, when the moving plate 6 is moved, the resilient contact elements of the contacts 2 are resiliently displaced into contact-releasing positions in which the resilient contact elements of the contacts 2 are disengaged from the external contacts 5 of the IC 4. Specifically, when the resilient contact elements of the contacts 2 are resiliently displaced into the contact-releasing positions, the external contacts 5 of the IC 4 are moved into adjacent with the resilient elements of the respective contacts 2 as shown in FIGS. 9 and 10, and when the resilient contact elements are resiliently displaced into the contacting positions, the resilient elements are resiliently pressed against inner surfaces of the external contacts 5, respectively as shown in FIGS. 11 and 12.

In any of the abovementioned examples, there can be employed contacts which each have a single resilient contact element to be pressed against a single side surface of each external contact, or contacts which each have a pair of resilient contact elements for resiliently pinching each external contact. The type of contacts may be suitably selected in accordance with necessity.

Figure 8:
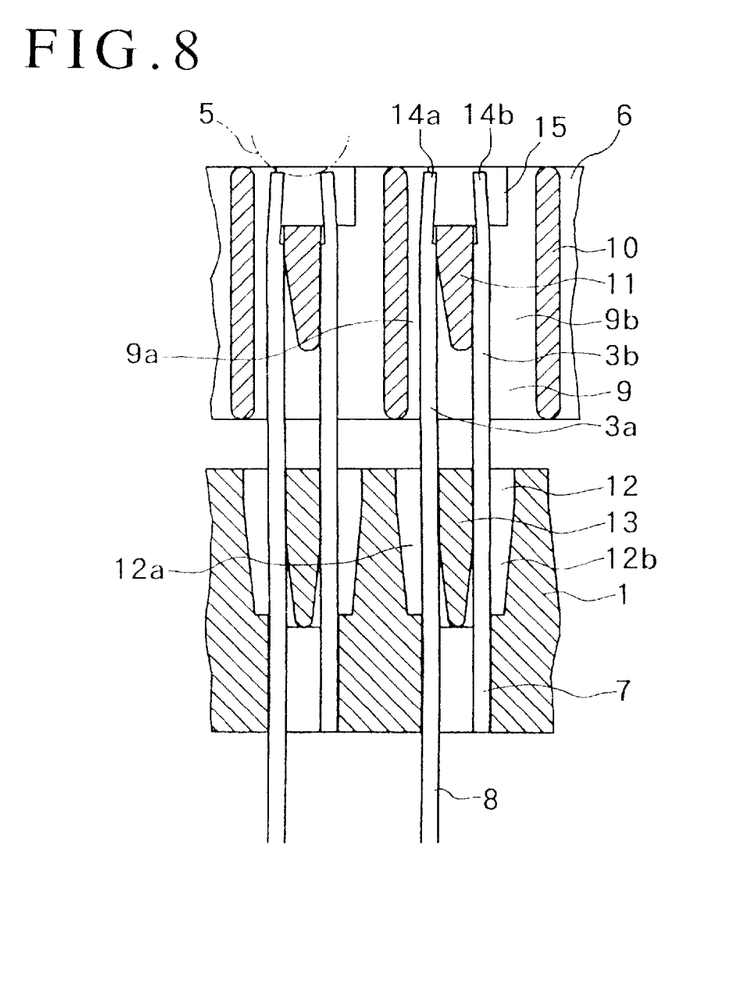
FIG. 8 is a sectional view taken along the diagonal line D of FIG. 7.

In the illustrated example as shown in FIG. 8, as well as elsewhere, there are employed contacts for resiliently pinching the external contacts of the IC 4 with a pair of resilient contact elements 3a, 3b. The resilient elements 3a, 3b are resiliently opened and closed in accordance with diagonal movement of the moving plate 6 so that the electrical connection and disconnection can be achieved.

The IC 4 is represented by a BGA (Ball Grid Array) type IC package, a PGA (Pin Grid Array) type IC package, or the like. The IC 4 as represented by a BGA type IC package includes ball type external contacts 5 formed of solder, or the like, as shown in FIGS. 13 and 14, whereas the IC 4 represented by a PGA type IC package includes slender pin type external contacts. Those external contacts 5 are arranged in a lattice pattern on the lower surface of the IC 4 such that the contacts of the columns Y5 and the contacts of the rows X5 are in parallel relation to the side Y4 and the side X4 of the square IC 4, respectively. The illustrated example is a representative example of an IC socket formed into a BGA type IC package.

The contacts 2 are arranged in a lattice pattern in correspondence with the lattice pattern arrangement of the external contacts 5 of the IC 4, such that the contacts of the column Y2 are in parallel relation to the side Y1 of the socket body 1 and the contacts of the rows X2 are in parallel to the side X1 of the socket body 1.

Each contact 2 has the pair of resilient contact elements 3a, 3b implanted in the socket body 1 and extending upwardly in parallel so as to be contacted with the corresponding external contact 5. Each contact 2 also has a male terminal 8 extending downwardly of the socket body 1 from the implanting area so as to be contacted with a wiring circuit board.

For each contact 2, basal portions of the resilient elements 3a, 3b are connected together at first side edges thereof through a connecting plate 7. The male terminal 8 extends downwardly from the basal end portion of the resilient contact element 3a, and the area forming the connecting plate 7 serves as the implanting area of each contact 2.

Each contact 2 as a whole is formed by blanking and bending a piece of sheet metal. The resilient contact elements 3a, 3b are placed in opposing relation at the blanking plane, and oriented such that the they can be resiliently displaced in a direction of a diagonal line F of the lattice pattern arrangement of the contacts. In other words, the resilient contact elements 3a, 3b are placed correctly in opposing relation on the diagonal line F. Accordingly, the planes (opposing planes) of the resilient contact elements 3a, 3b are disposed at right angles or angles near right angles with respect to the diagonal line.

Owing to the abovementioned arrangement, the resilient contact elements 3a, 3b can be resiliently displaced in the diagonal direction on a diagonal movement path of the moving plate 6.

As mentioned above, the moving plate 6 is disposed in such a manner as to be able to move diagonally towards a corner portion on the diagonal line F, so that when the moving plate 6 is diagonally moved, the moving plate 6 acts on the resilient element 3a such that the resilient element 3a is resiliently displaced along the diagonal line F to thereby open and close the resilient contact elements 3a, 3b.

More specifically, the moving plate 6 includes contact receiving holes 9 arranged in a lattice pattern in correspondence with the arrangements of the external contacts 5 of the IC 4 and the contacts 2. The contact receiving holes 9 receive therein the resilient contact elements 3a, 3b extending upwardly from the socket body 1. Reference numeral 10 denotes insulating partition walls for isolating the contact receiving holes 9.

The moving plate 6 is formed of a square insulating plate, and the contact receiving holes 9 are arranged in the same lattice pattern as that of the contacts so that the columns Y2 and the rows X2 of the contact receiving holes 9 are in parallel relation to the side Y3 and the side X3 of the moving plate 6, respectively.

The moving plate 6 is integrally provided with an upper interposing wall 11 interposed between the resilient contact elements 3a, 3b received in the contact receiving holes 9. The socket body 1 is provided with the contact receiving holes 12 for receiving therein the basal portions of the resilient contact elements 3a, 3b extending upwardly from the implanting area. The socket body 1 is further integrally provided with a lower interposing wall 13 interposed between the resilient contact elements 3a, 3b received in each of the receiving holes 12.

Figure 7:
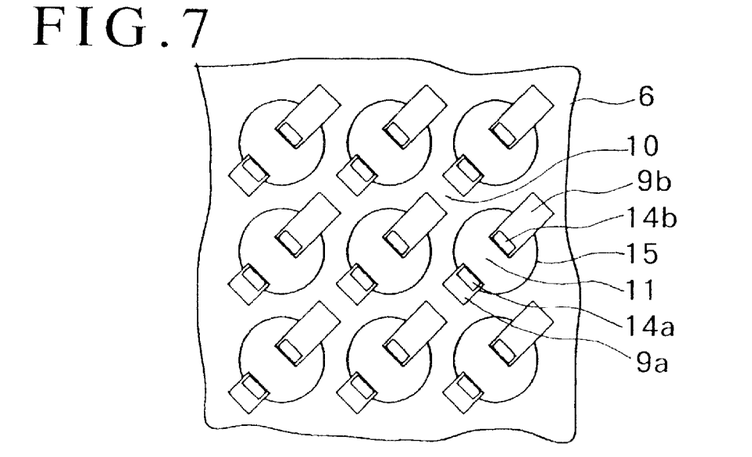
FIG. 7 is a plan view of main portions of the contacts and the moving plate when in their standby positions.

As shown in FIGS. 7 and 8, the resilient contact elements 3a, 3b are, when in their normal condition, in abutment with the lower interposing wall 13 or the upper interposing wall 11 and accumulate resilient force. That is, they are held in their preloaded condition.

When the upper interposing wall 11 and the lower interposing wall 13 are interposed between the resilient contact elements 3a, 3b, the contact receiving holes 9, 12 are divided into two portions. The resilient contact elements 3a, 3b are loosely inserted into such divided holes 9a, 9b so that the contact elements 3a, 3b can be resiliently displaced within the resilient contact insertion holes 9a, 12a.

Distal end portions of the resilient contact elements 3a, 3b extending through the resilient element insertion holes 9a, 12a project upwardly of the upper interposing wall 11. The distal end portions of the resilient contact elements 3a, 3b define the pressure contact elements 14a, 14b for resiliently pinching the external contacts 5.

Figure 6:
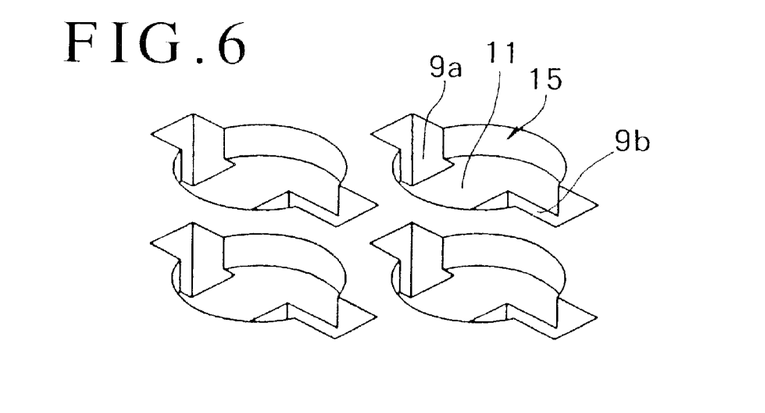
FIG. 6 is an enlarged perspective view of receiving portions for ball type external contacts.

Formed in the area where the pressure contact elements 14a, 14b are present, are ball receiving portions 15 each having a generally circular configuration for receiving therein the ball type external contacts 5 so that the ball type external contacts 5 are correctly positioned.

The IC 4 is placed on the upper surface of the moving plate 6 such that the ball type external contacts 5 are received in the ball receiving portions 15. The ball receiving portions 15 are arranged in correspondence with the intervals between the pressure contact elements 14a, 14b. The ball type external contacts 5 are placed on distal end faces of the resilient contact elements 3a, 3b shown in FIG. 8. Owing to this arrangement, when the moving plate 6 is diagonally moved in a first direction to open the resilient contact elements 3a, 3b in the diagonal direction, the ball type external contacts 5 are dropped between the resilient contact elements 3a, 3b so as to be received in the receiving portions 15, and the IC 4 is supported on the upper surface of the moving plate 6.

When the moving plate 6 is diagonally moved a second direction (opposite the first direction) to allow the resilient contact elements 3a to be restored in the diagonal movement direction toward their original positions, the ball type external contacts 5 are each resiliently pinched between the contact elements 3a, 3b in the diagonal direction.

Diagonal movement force is imposed upon the moving plate 6 using a proper moving means such as a lever, a jig, or the like provided on the socket. In the illustration, the moving means of the moving plate 6 includes levers 16, 17.

A basic construction of the levers 16, 17 is disclosed in Japanese Patent Publication Nos. 30280/94 and 32870/93. In the illustrated example, an improvement is made in order to appropriately obtain the diagonal movement force while utilizing the basic construction of the levers.

The illustrated example will now be described specifically. The socket body 1 is formed into a box-like configuration to thereby define a square moving plate receiving portion 20. The moving plate 6 is diagonally movably receiving in this receiving portion 20. The moving plate 6 is integrally provided with joining parts 18, 19 projecting from opposite corner portions on the diagonal line F of the moving plate 6. The levers 16, 17 are turnably supported by the joining parts 18, 19. The joining parts 18, 19 include opposite side surfaces which are in parallel relation to the diagonal line F, in other words, opposite side surfaces 21, 22 which are in parallel relation to the diagonal path of the moving plate 6 and which turnably support the levers 16, 17 at side surfaces thereof.

Figure 5A:
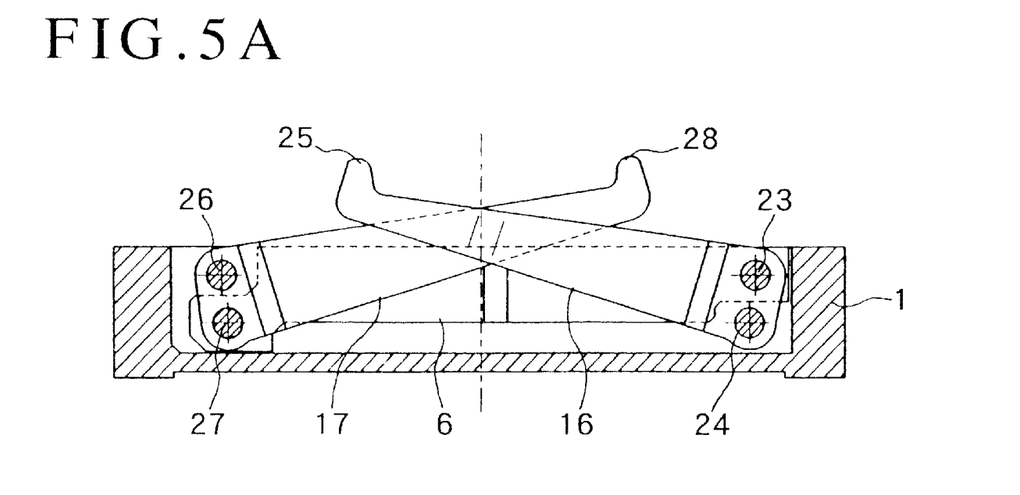
FIG. 5A is an explanatory view for explaining the operation of a lever and the moving plate when the lever is turned upwardly.
Figure 5B:
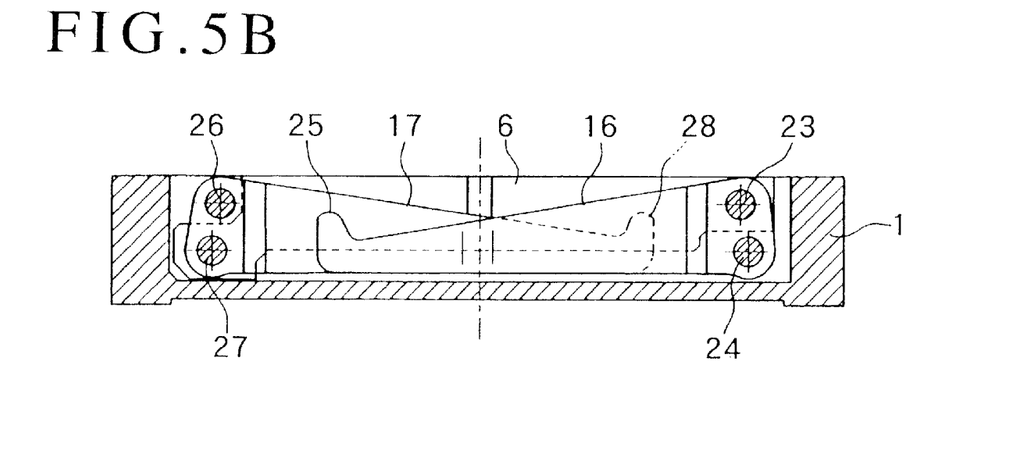
FIG. 5B is likewise an explanatory view but when the lever is turned downwardly.

More specifically, as shown in FIGS. 5A and 5B, as well as elsewhere, an upper portion of the basal end of the lever 16 is turnably supported on a side surface of the corner portion of the socket body 1 through a support pin 23, and a lower portion of the lever 16 is turnably supported on the side surface 21 of the joining part 18 of the moving plate 6 through a transmission shaft 24. The lever 16 is allowed to extend along the side surface of the socket body 1 from the respective pivot portions, and a pressure receiving portion 25 formed of an upwardly projecting portion is defined on the distal end thereof.

Similarly, an upper portion of the basal end of the other lever 17 is turnably supported on a side surface 22 of the joining part 19 of the moving plate 6 through a transmission shaft 26, and a lower portion of the lever 17 is turnably supported on the side surface of the corner portion of the socket body 1 through a support pin 27, that is, turnably supported on the inner surface of the corner portion of the moving plate receiving portion 20 which receives the joining part 19. The lever 17 is allowed to extend along the side surface of the moving plate 6 from the respective pivot portions, and a pressure receiving portion 28 formed of an upwardly projecting portion is defined on the distal end thereof.

As one example, a pair of the levers 16 are disposed on opposing side surfaces 21 of the joining part 18, whereas a pair of the levers 17 are disposed on opposing side surfaces 22 of the joining part 19.

As another example, the lever 16 extends along the side surface of the moving plate 6 adjacent to the joining part 18 and further along the side surface adjacent the joining part 19, whereas the lever 17 extends along the side surface of the moving plate 6 adjacent to the joining part 19 and further along the side surface adjacent to the joining part 18. Accordingly, the levers 16, 17 exhibit L-shaped configurations and extend in mutually opposite directions along the two side surfaces defining the corner portion in such a manner as to bend around the corner portion of the moving plate 6. The pressure receiving portion 25 of the lever 16 is disposed at a central portion of one of the two side surfaces defining the corner portion, whereas the pressure receiving portion 28 of the lever 17 is likewise disposed on the central portion of the other side surface defining the corner portion.

The levers 16, 17 extend along the inner side surface of the moving plate receiving portion 20. That is, the levers 16, 17 extend along each side surface within the space between an outer side surface of the moving plate 6 and an inner side surface of the receiving portion 20, with the pressure receiving portions 25, 28 projecting upwardly from the upper opening surface of the receiving portion 20.

An upper control member 29 is upwardly and downwardly movably overlain above an upper part of the socket body 1. The upper control member 29 is formed of a square framework. A frame wall 30 of the control member 29 is placed on the pressure receiving portions 25, 28 and a return spring 31 such as a coil spring, or the like, is interposed between the upper control member 29 and the socket body 1.

The control member 29 is depressed by robot or finger against the resilient force of the spring 31. The depression of the control member 29 in turn depresses the pressure receiving portions 25, 28 to turn the levers 16, 17 downwardly. When the levers 16, 17 are turned upwardly, the control member 29 is pushed upwardly by the pressure receiving portions 25, 28 and the spring 31. The moving plate 6 is reciprocally moved by the upward and downward turning of the levers 16, 17.

More specifically, as shown in FIGS. 3A–3B, 7 and 8, in a standby condition, the resilient contact elements 3a, 3b are brought into abutment with the side surface of the upper or lower interposing wall 11 or 13 to store a resilient force, the levers 16, 17 are in upward positions, and the upper control member 29 is pushed upwardly.

As shown in FIGS. 4A–4B, 9 and 10, when the upper control member 29 is depressed by robot or the like from the above standby state, the pressure receiving portions 25, 28 are depressed to turn the levers 16, 17 downwardly. When the levers 16, 17 are turned downwardly, the transmission shafts 24, 26 apply a diagonal movement force in one direction to the moving plate 6.

As a consequence, as shown in FIGS. 9 and 10, the moving plate 6 is diagonally moved towards one corner portion along the diagonal line F of the socket body 1. This diagonal movement of the moving plate 6 causes the upper interposing wall 11 to press the resilient contact element 3a of each contact 2 so that the resilient contact element 3a is resiliently displaced in the diagonal movement direction. A ball type external contact 5 of the IC 4 can then be interposed, with no load, between the pressure contact elements 14a, 14b of the resilient contact elements 3a, 3b dilated as a result of such resilient displacement and correctly received in the receiving portion 15.

As shown in FIGS. 11 and 12, when the depressing force to the upper control member 29 is canceled, the resilient contact element 3a is resiliently displaced in the diagonal movement direction by its own restoring force while pressing the upper interposing wall 11, so as to cause pinching, under pressure, of the ball type external contact 5 between the pressure contact element 14a and 14b of the resilient contact elements 3a, 3b.

At the same time, when the resilient contact element 3a presses the upper interposing wall 11 by its restoring force, the moving plate 6 is moved diagonally towards the other corner portion of the socket body 1. This diagonal movement applies an upward turning force to the levers 16, 17 through the transmission shafts 24, 26. When the levers 16, 17 are turned upwardly, the pressure receiving portions 25, 28 push the upper control member 29 upwardly. The spring 31 is adapted to further ensure this pushing up operation.

As a preferred example, the moving plate 6 is diagonally moved at 45 degrees with respect to the side X1 of the socket body 1. Specifically, as shown in the illustration, the moving plate 6 and the socket body 1 are each formed into a generally regular square configuration, and the diagonal movement path at 45 degrees from the side X1 as mentioned above is brought into perfect alignment with the diagonal line F.

It is accepted, however, that the socket body 1 or the moving plate 6 can be formed into a rectangular configuration, the diagonal line F of the socket body 1 may not be brought into perfect alignment with the diagonal movement path of the moving plate 6, and the area in the vicinity of the diagonal line F of the moving plate 6 may be diagonally moved towards a corner portion of the socket body 1.

An angle of diagonal movement, namely, an angle a of inclination, of the moving plate 6 may be angles other than 45 degrees with respect to the side X1 of the socket body 1, such as, for example, an angle ranging from 30 to 60 degrees. In other words, the present invention includes a case where the moving plate 6 is diagonally moved at 46 degrees or at an angle a other than 45 degrees with respect to the lateral side X1 of the socket body 1 and the moving plate 6 is diagonally moved towards a corner portion of the socket body 1.

The resilient contact elements 3a, 3b of the contacts 2 are oriented such that they can be diagonally resiliently displaced in the diagonal movement direction of the moving plate 6. In other words, the contacts 2 arranged in the columns Y2 and the rows X2 are arranged in parallel relation to the side Y1 and the side X1 of the socket body 1, and the resilient contact elements 3a, 3b of each contact 2 are arranged at an angle a of inclination with respect to the side X1 so that the moving plate 6 can be resiliently displaced in the diagonal movement direction of the moving plate 6.

According to the present invention, since the columns and the rows of the contacts 2 arranged in a lattice pattern are arranged in parallel relation to the sides of the socket body 1, the contacts can be arranged at high density in a socket body of a limited size, a sufficient resilient displacement space for the resilient contact element of each contact can be obtained, and a smaller pitch arrangement of the external contacts of an IC can be accommodated effectively without enlarging the size of the socket body.

Although a specific embodiment of the invention has been described, it will be appreciated that the invention is susceptible to modification, variation and change without departing from its proper scope as exemplified by the following claims.

What is claimed is:

1. An IC socket for receiving an IC having external IC contacts, comprising:

a generally rectangular socket body having sidewalls;

a plurality of socket contacts mounted in said socket body;

a moving plate movably mounted on said socket body for movement back and forth along an angled line which is angled with respect to said sidewalls of said socket body;

wherein said moving plate has a plurality of contact-receiving holes formed therethrough and a top surface exposed upwardly for supporting the IC thereon such that, when said moving plate is moved along the angled line, the IC is also moved along the angled line and the external IC contacts are moved into engagement and out of engagement with said socket contacts, respectively, when the IC is supported on said top surface of said moving plate;

wherein said moving plate includes interposing walls disposed within said contact-receiving holes, respectively;

wherein each of said interposing walls has an uppermost end disposed below said top surface of said moving plate;

wherein each of said interposing walls divides a respective one of said contact-receiving holes, into a pair of contact insertion holes; and wherein each of said socket contacts is bifurcated into a pair of resilient contact elements, said resilient contact elements being disposed in said contact insertion holes, respectively.

2. An IC socket according to claim 1, wherein the angled line along which said moving plate is movable comprises a diagonal line extending through diagonally opposed corners of said socket body, such that said moving plate is movable toward and away from said diagonally opposed corners of said socket body.

3. An IC socket according to claim 1, wherein said contact-receiving holes open through said top surface of said moving plate for receiving the external IC contacts of the IC, respectively, such that said socket contacts are engageable with said IC contacts within said contact-receiving holes.

4. An IC socket according to claim 1, wherein uppermost ends of said socket contacts are disposed above said uppermost ends of said interposing walls, respectively, and below said top surface of said moving plate.

5. An IC socket according to claim 1, wherein uppermost ends of said socket contacts are disposed above said uppermost ends of said interposing walls, respectively.

6. An IC socket according to claim 1, wherein each said pair of said resilient contact elements is arranged to receive a respective one of the IC contacts therebetween.

7. An IC socket according to claim 1, wherein said socket contacts are resiliently deflectable along said angled line, respectively.

8. An IC socket according to claim 1, further comprising a lever coupled to said moving plate and movable between a first position for deflecting said socket contacts into an IC contact receiving condition, and a second position for allowing said socket contacts to move into an IC contact engaging position.

9. An IC socket according to claim 8, further comprising an upper control member movably disposed above said socket body for movement between a lowered position for pressing said lever toward said first position, and a raised position for allowing said lever to move to said second position.

10. An IC socket according to claim 8, wherein said socket contacts resiliently bias said moving plate in a direction to push said lever toward said second position.

11. An IC socket according to claim 1, further comprising means for moving said moving plate between a first position for deflecting said socket contacts into an IC contact receiving condition, and a second position for allowing said socket contacts to move into an IC contact engaging position.

12. An IC socket according to claim 11, wherein said socket contacts resiliently bias said moving plate toward said second position.

13. An IC socket for receiving an IC having external IC contacts. comprising:
a generally rectangular socket body having sidewalls;
a plurality of socket contacts mounted in said socket body;
a moving plate movably mounted on said socket body for movement back and forth along an angled line which is angled with respect to said sidewalls of said socket body;
wherein said moving plate has a plurality of contact receiving-holes formed therethrough;
wherein portions of said socket contacts are disposed in said contact receiving-holes, respectively;
wherein said contact-receiving holes open through a top surface of said moving plate for receiving the external IC contacts of the IC, respectively, such that said socket contacts are engageable with the IC contacts within said contact-receiving holes;
wherein said moving plate includes interposing walls disposed within said contact-receiving holes, respectively;
wherein each of said interposing walls has an uppermost end disposed below said top surface of said moving plate;
wherein each of said interposing walls divides a respective one of said contact-receiving holes, into a pair of contact insertion holes; and
wherein each of said socket contacts is bifurcated into a pair of resilient contact elements, said resilient contact elements being disposed in said contact insertion holes, respectively.

14. An IC socket according to claim 13, wherein the angled line along which said moving plate is movable comprises a diagonal line extending through diagonally opposed corners of said socket body, such that said moving plate is movable toward and away from said diagonally opposed corners of said socket body.

15. An IC socket according to claim 13, wherein uppermost ends of said socket contacts are disposed above said uppermost ends of said interposing walls, respectively, and below said top surface of said moving plate.

16. An IC socket according to claim 13, wherein uppermost ends of said socket contacts are disposed above said uppermost ends of said interposing walls, respectively.

17. An IC socket according to claim 13, wherein each said pair of said resilient contact elements is arranged to receive a respective one of the IC contacts therebetween.

18. An IC socket according to claim 13, wherein said socket contacts are resiliently deflectable along said angled line, respectively.

19. An IC socket according to claim 13, further comprising a lever coupled to said moving plate and movable between a first position for deflecting said socket contacts into an IC contact receiving condition, and a second position for allowing said socket contacts to move into an IC contact engaging position.

20. An IC socket according to claim 19, further comprising an upper control member movably disposed above said socket body for movement between a lowered position for pressing said lever toward said first position, and a raised position for allowing said lever to move to said second position.

21. An IC socket according to claim 18, wherein said socket contacts resiliently bias said moving plate in a direction to push said lever toward said second position.

22. An IC socket according to claim 13, further comprising means for moving said moving plate between a first position for deflecting said socket contacts into an IC contact receiving condition, and a second position for allowing said socket contacts to move into an IC contact engaging position.

23. An IC socket according to claim 22, wherein said socket contacts resiliently bias said moving plate toward said second position.

* * * * *